(12) United States Patent
Fang

(10) Patent No.: US 11,199,584 B2
(45) Date of Patent: Dec. 14, 2021

(54) IC DIES WITH PARALLEL PRBS TESTING OF INTERPOSER

(71) Applicant: Credo Technology Group Limited, Grand Cayman (KY)

(72) Inventor: Calvin Xiong Fang, Palo Alto, CA (US)

(73) Assignee: Credo Technology Group Limited, Grand Cayman (KY)

(*) Notice: Subject to any disclaimer, the term of this patent is extended or adjusted under 35 U.S.C. 154(b) by 165 days.

(21) Appl. No.: 16/640,255

(22) PCT Filed: Jan. 17, 2018

(86) PCT No.: PCT/US2018/014045
§ 371 (c)(1),
(2) Date: Feb. 19, 2020

(87) PCT Pub. No.: WO2019/143327
PCT Pub. Date: Jul. 25, 2019

(65) Prior Publication Data
US 2020/0379044 A1 Dec. 3, 2020

(51) Int. Cl.
*G01R 31/3183* (2006.01)
*G01R 31/28* (2006.01)
(Continued)

(52) U.S. Cl.
CPC .. *G01R 31/318385* (2013.01); *G01R 31/2836* (2013.01); *G01R 31/2853* (2013.01);
(Continued)

(58) Field of Classification Search
CPC ........ G01R 31/318385; G01R 31/2836; G01R 31/2853; G01R 31/31703; G01R 31/31926; H01L 25/0655
(Continued)

(56) References Cited

U.S. PATENT DOCUMENTS 5,617,427 A    4/1997   Ohta et al.
6,760,873 B1 *   7/2004   Hao ................... G01R 31/3016
                                                     324/73.1

(Continued)

FOREIGN PATENT DOCUMENTS

CN        1642118 A    7/2005
CN    101213520 A    7/2008
(Continued)

OTHER PUBLICATIONS

Wang et al., Scan-Based Testing of Post-Bond Silicon Interposer Interconnects in 2.5-D ICs, Sep. 2014, IEEE, vol. 33, No. 9, pp. 1410-1423. (Year: 2014).*
(Continued)

*Primary Examiner* — John J Tabone, Jr.
(74) *Attorney, Agent, or Firm* — Ramey & Schwaller LLP; Daniel J. Krueger

(57) ABSTRACT

Accordingly, an improved interposer connection testing technique is provided, employing parallel pseudo-random bit sequence (PRBS) generators to test all the interconnects in parallel and simultaneously detect any correctable defects. In one embodiment, a microelectronic assembly includes an interposer electrically connected in a flip-chip configuration to an originating IC (integrated circuit) die and to a destination IC die, the substrate having multiple conductive traces for a parallel communications bus between the IC dies. The originating IC die has a first parallel PRBS (pseudo-random binary sequence) generator to drive test PRBSs with different phases in parallel across the interposer traces. The destination IC die has a second parallel PRBS generator to create reference PRBSs with different phases, and a bitwise comparator coupled to receive the test PRBSs from the interposer traces and to compare them to the
(Continued)

reference PRBSs to provide concurrent fault monitoring for each of the traces.

20 Claims, 4 Drawing Sheets

(51) Int. Cl.
   *G01R 31/317* (2006.01)
   *G01R 31/319* (2006.01)
   *H01L 25/065* (2006.01)
(52) U.S. Cl.
   CPC . *G01R 31/31703* (2013.01); *G01R 31/31926* (2013.01); *H01L 25/0655* (2013.01)
(58) Field of Classification Search
   USPC ....... 714/728, 724, 726, 727, 729, 733, 735, 714/736, 738, 739, 742
   See application file for complete search history.

(56) References Cited

U.S. PATENT DOCUMENTS

| | | |
|---|---|---|
| 7,822,110 B1 | 10/2010 | Doblar |
| 8,898,526 B1 | 11/2014 | Noujeim |
| 9,474,034 B1* | 10/2016 | Baumgartner ............ H04L 7/08 |
| 2001/0021987 A1 | 9/2001 | Govindarajan et al. |
| 2002/0120897 A1 | 8/2002 | Eby |
| 2003/0063566 A1 | 4/2003 | Abramovitch et al. |
| 2003/0085461 A1 | 5/2003 | Sakiyama et al. |
| 2005/0071399 A1 | 3/2005 | Bonaccio et al. |
| 2005/0243893 A1 | 11/2005 | Ranganathan et al. |
| 2006/0253752 A1* | 11/2006 | Krishnan ......... G01R 31/31715 714/724 |
| 2007/0018672 A1 | 1/2007 | Jacobsen et al. |
| 2009/0074407 A1 | 3/2009 | Hornbuckle et al. |
| 2009/0319838 A1 | 12/2009 | Jones, Jr. |
| 2011/0291732 A1* | 12/2011 | Pavlovic ............... H03M 1/066 327/299 |
| 2013/0181737 A1 | 7/2013 | Liu et al. |
| 2014/0241727 A1 | 8/2014 | Lim et al. |
| 2015/0002971 A1 | 1/2015 | Lim et al. |
| 2015/0168493 A1* | 6/2015 | Whetsel ............. G01R 31/3177 714/727 |
| 2015/0358106 A1* | 12/2015 | Limberg ............. H04L 27/2273 375/308 |

FOREIGN PATENT DOCUMENTS

| | | |
|---|---|---|
| CN | 101485146 A | 7/2009 |
| CN | 101500253 A | 8/2009 |
| CN | 102340362 A | 2/2012 |
| CN | 102664765 A | 9/2012 |
| CN | 103460365 A | 12/2013 |
| CN | 104205647 A | 12/2014 |
| CN | 104737508 A | 6/2015 |
| CN | 111183517 A | 5/2020 |

OTHER PUBLICATIONS

Wang et al., Built-In Self-Test for Interposer-Based 2.5D ICs, 2014, IEEE, pp. 181-188. (Year: 2014).*
International Search Report and Written Opinion for corresponding PCT/US2018/014045 dated Oct. 12, 2018.
Laskin, Ekaterina, (2006) "On-Chip Self-Test Circuit Blocks for High-Speed Applications", (Master's Thesis), University of Toronto, retrieved from https://doi.org/http://www.eecg.toronto.edu/~sorinv/theses/laskin_MASc_thesis.pdf.
First Office Action for Chinese Application No. 201710666379.3 dated Jun. 23, 2020.
International Preliminary Report on Patentability for International Application No. PCT/US2018/014045 dated Jul. 21, 2020.
First Office Action for Chinese Application No. 201611273046.6 dated Feb. 3, 2020.

* cited by examiner

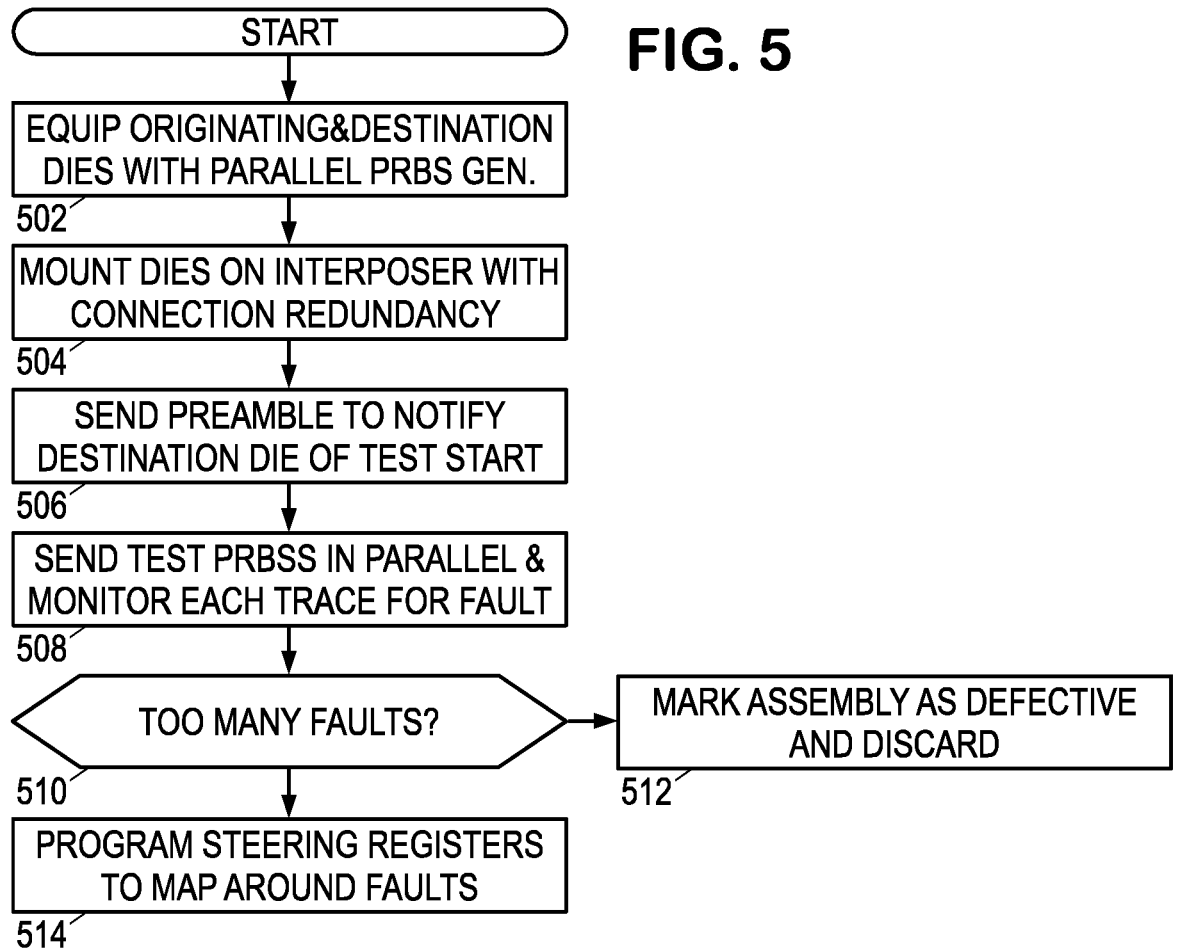
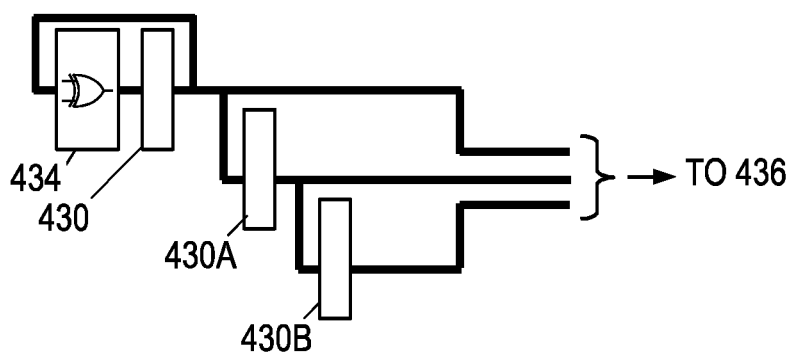

IC DIES WITH PARALLEL PRBS TESTING OF INTERPOSER

BACKGROUND

Integrated circuits ("ICs") are incorporated into many electronic devices. IC packaging has evolved such that multiple ICs may be vertically joined together in so-called three-dimensional ("3D") packages in order to save horizontal area on a printed circuit board ("PCB"). Another packaging method, referred to as 2.5D IC packaging, incorporates an interposer, which may be formed from a semiconductor material such as silicon, for coupling one or more dies to a PCB. The ability to package multiple dies together on an interposer offers a number of potential advantages. The different dies can be made with different process technologies best suited to each die's function, e.g., analog, digital, memory, transducer, etc., as contrasted with a monolithic solution where the various function implementations need to be adapted to the same manufacturing process. Further, because they are implementing specific functions, the individual dies can be smaller, which typically provides improved manufacturing yields and a commensurately reduced manufacturing cost which more than offsets the packaging cost of the 2.5D IC device package.

Interconnections between the dies are formed by conductive traces on the interposer. As the interposer itself has few or no integrated devices, and as the feature size requirements are generally more relaxed, the interposer may be manufactured using a mature process technology to pattern the metal layers that provide the conductive traces and contact pads. Micro bumps on the IC dies and the interposer are used to form the electrical connections between the conductive traces and contact pads on the IC dies. Micro bumps may be very small (e.g., 20 um bump diameter and 40 um pitch) and consequently tend to suffer an increased rate of manufacturing faults (mostly open circuits). The interposer may be equipped with redundant traces, e.g., an extra trace can be added for every 16 bit connections, so that 17 traces are available to convey 16 bits of information in parallel. If one of the connections is faulty, the 16 bits can be mapped to the functioning traces to be conveyed around the faulty connection. In this fashion, the redundancy enables the packaged device to operate correctly even in the presence of a limited number of faults.

To ensure that faults are detected and appropriate use of functioning traces is made, the manufacturer tests the connections after the IC dies have been mounted to the interposer. Existing tests are performed in phases, with an initial verification test being followed by subsequent phases only if the verification test has failed. The subsequent phases provide testing in a lengthy connection-by-connection testing sequence, followed by a programming phase to re-map information to functioning traces.

SUMMARY

Accordingly, an improved interposer connection testing technique is disclosed herein, employing parallel pseudo-random bit sequence (PRBS) generators to test all the interconnects in parallel and simultaneously detect any correctable defects, enabling re-mapping to be performed without additional testing phases. In one embodiment, a microelectronic assembly includes an interposer electrically connected in a flip-chip configuration to an originating IC (integrated circuit) die and to a destination IC die, the substrate having multiple conductive traces for a parallel communications bus between the originating and destination IC dies. The originating IC die has a first parallel PRBS (pseudo-random binary sequence) generator to drive test PRBSs with different phases in parallel across the multiple conductive traces. The destination IC die has: a second parallel PRBS generator to create reference PRBSs with different phases; and a bitwise comparator coupled to receive the test PRBSs from the multiple conductive traces and to compare the test PRBSs to the reference PRBSs to provide concurrent fault monitoring for each of the multiple conductive traces.

In an illustrative embodiment of a microelectronic assembly test method, the method includes: (a) receiving a start pattern synchronously on each of multiple interposer traces coupling an originating IC die to a destination IC die; (b) initializing a parallel PRBS generator upon detecting the start pattern; (c) performing a bitwise comparison of reference PRBSs from the parallel PRBS generator with test PRBSs received via the multiple interposer traces; (d) identifying which, if any, of the multiple interposer traces are faulty based on the bitwise comparison; and (e) if a faulty interposer trace is detected, configuring the originating IC die and the destination IC die to avoid use of the faulty interposer trace.

An illustrative IC die embodiment includes: a set of input multiplexers that map N bits along N+1 interposer traces connecting said IC die to another IC die; a set of test multiplexers that insert on each of said interposer traces a corresponding one of multiple test PRBSs; and a parallel PRBS generator that provides the multiple test PRBSs in parallel to the set of test multiplexers, the multiple test PRBSs having different phases.

Each of the foregoing embodiments may be implemented individually or conjointly, and may be implemented with any one or more of the following features in any suitable combination: (1) the test PRBSs are preceded by a start pattern. (2) the start pattern has at least one "zero" sent simultaneously on each of the multiple conductive traces followed by a "one" sent simultaneously on each of the multiple conductive traces. (3) the first parallel PRBS generator is iterated starting with a seed value. (4) the second parallel PRBS generator is initialized with the seed value when a start pattern is detected on the multiple conductive traces. (5) the first and second parallel PRBS generators each provide echoed PRBSs for an expanded number of parallel sequences. (6) the parallel communications bus is N bits wide. (7) the multiple conductive traces of the substrate include at least one extra trace to provide redundancy protection against a faulty trace. (8) either or both of the originating and destination IC dies includes a multiplexer array that enables signals for the parallel communications bus to be routed around the faulty trace. (9) the destination IC die includes a correction controller coupled to the bitwise comparator to identify which if any of the multiple conductive traces have a fault and to responsively determine a setting for at least one of the multiplexer arrays to route around the fault. (10) initializing includes storing a predetermined seed value in a register as an initial state for the parallel PRBS generator. (11) the method further includes: (f) iterating to generate on each clock cycle a subsequent state from a present state in the register; (g) deriving from each bit in the register a corresponding one of the reference PRBSs; and (h) echoing at least one of the reference PRBSs derived from the register bits to provide at least one additional one of the reference PRBSs. (12) said configuring includes programming the multiplexer arrays to route communication signals around the faulty trace using one or more redundant interposer traces. (13) a set of output multiplexers that map receive signals from N+1 interposer traces to N output bit lanes, the receive signals including incoming test PRBSs during testing. (14) a bitwise comparator that compares each of the incoming test PRBSs with corresponding reference PRBSs. (15) a second parallel PRBS generator that provides the reference PRBSs in parallel to the bitwise comparator, the reference PRBSs having different phases. (16) the parallel PRBS generator includes a preamble multiplexer to insert a start pattern ahead of the multiple test PRBSs. (17) the parallel PRBS generator echoes one or more of the multiple test PRBSs for an expanded number of parallel sequences. (18) a set of latches driven synchronously by a clock signal that is also communicated via a dedicated interposer trace.

BRIEF DESCRIPTION OF THE DRAWINGS

In the drawings:

FIG. 5 is a flow diagram of an illustrative parallel PRBS test method for interposer connections.

FIG. 6 is a schematic of an illustrative echoing technique for parallel PRBSs.

Figure 1:
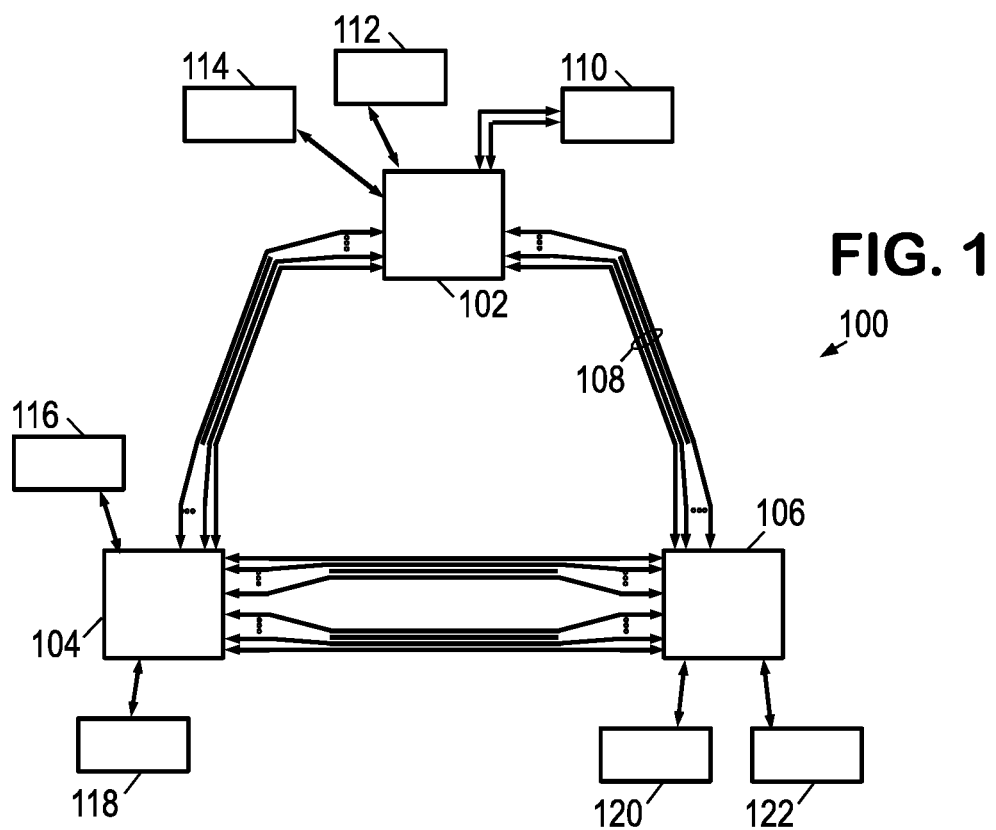
FIG. 1 shows an illustrative computer network.

It should be understood, however, that the specific embodiments given in the drawings and detailed description do not limit the disclosure. On the contrary, they provide the foundation for one of ordinary skill to discern the alternative forms, equivalents, and modifications that are encompassed in the scope of the appended claims.

NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

An integrated circuit ("IC") die is a diced unit of an IC wafer. (Herein, "dies" will be employed as the plural form of a die.) The packaged form of a singular IC die, with nodes, pins, posts, pads, terminals, leads, bumps, balls, or other electrical contacts (collectively referenced herein as "contacts") ready for soldering or other electrically-connected incorporation into a larger electrical circuit or system, may be termed an IC chip. When multiple IC dies are packaged together, e.g., as a multichip module or system-in-package, the packaged unit is herein termed a "microelectronic assembly". The multiple IC dies may be attached directly to the package substrate, which can take the form of a laminated circuit board or a ceramic, glass, or semiconductor substrate, and generally has printed or etched traces significantly (orders of magnitude) larger than the traces on the IC dies. As this size discrepancy can adversely affect communications performance between the IC dies, at least some microelectronic assemblies employ so-called 2.5D or 3D technologies. In 3D technology, the IC dies are stacked atop each other to provide direct electrical connections between adjacent dies. However, such stacking can make it difficult for the package to provide adequate heat dissipation. In 2.5D technology, at least some of the IC dies are attached to an "interposer", which in turn may be attached to the package substrate. The interposer may be a silicon substrate that employs through-silicon vias (TSVs) to provide contacts on both its upper surface (for the IC dies) and its lower surface (for the package substrate). Traces on the interposer can more closely match the size of the traces on the IC dies for improved communications performance between the dies, and may incorporate intentional inductance and capacitance elements to provide better impedance matching with the contacts and traces on the package substrate. So long as their density and power dissipation is constrained, a limited number of active devices (e.g., transistors) may be incorporated into the interposer without facing the heat dissipation difficulties of 3D technology.

The term "substrate", when unqualified, may refer to a package substrate, an interposer, an IC die, or any other form of platform that provides contacts for electrically connecting the integrated circuit elements of the die to the other elements or external contacts of the microelectronic assembly.

"N" is used to indicate a positive integer value, usually a power of 2 such as $2^4$, $2^5$, $2^6$, or $2^7$, representing the width of a parallel data bus.

DETAILED DESCRIPTION

The disclosed apparatus and methods are best understood in the context of the larger environments in which they may operate. Accordingly, FIG. 1 shows an illustrative communications network 100 having communications links 108 interconnecting nodes 102, 104, 106 (representing switches, routers, base stations, gateways, and other forms of communications equipment) that direct and relay communications signals between terminal nodes 110-122 (which may represent mobile devices, portable computers, workstations, servers, network-attached storage systems, and other such communications sources and destinations). The communications network 100 may be or include, for example, the Internet, a wide area network, or a local area network.

Communication links 108 may be fiberoptic cables having bundles of optical fibers each carrying multiple modulated light signals on corresponding channels. Many fiberoptic cables have multiple bundles of optical fibers, with each fiber carrying multiple channels. With such dense packing of information signals, highly integrated communications transceivers are advantageous for efficient interfacing with communications equipment. It is desirable to combine the integrated circuits for multiple transmitter modules and multiple receiver modules into a single device, such as a 2.5D IC device package.

Figure 2:
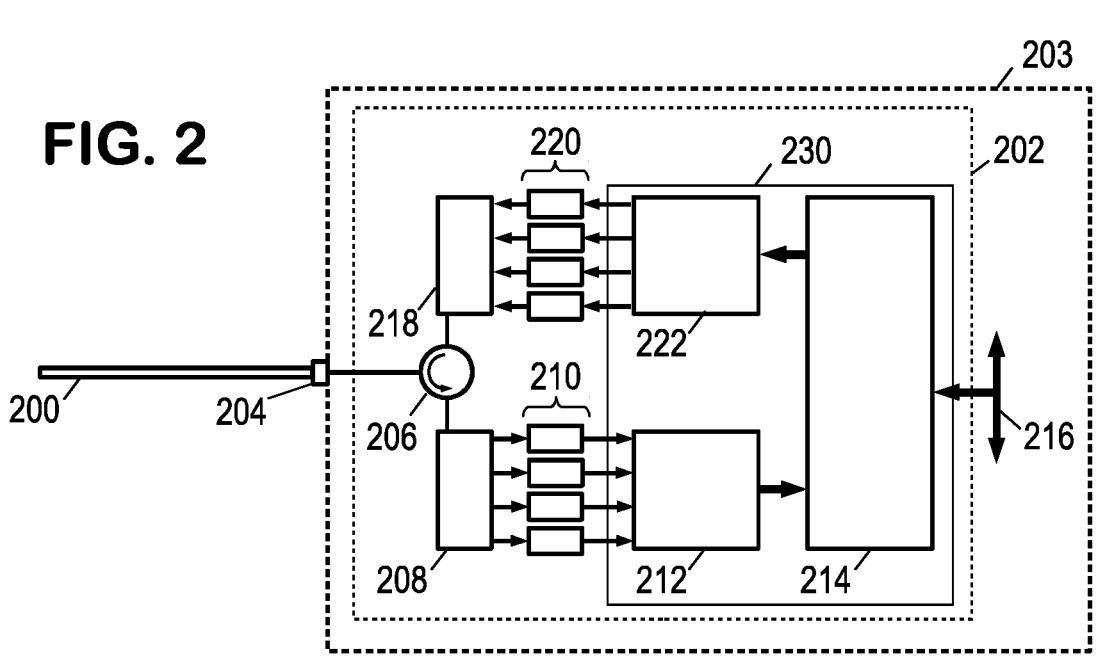
FIG. 2 is a function-block diagram of an illustrative transceiver.

FIG. 2 shows an individual optical fiber 200 coupled to an illustrative transceiver 202 in a terminal node 203. (Each optical fiber in a bundle may be coupled to a different transceiver in the terminal node.) An optical connector 204 couples the fiber 200 to an optical circulator 206. The circulator 206 forwards incoming light signals to a channel splitter 208, which separates the various channels and provides one to each detector 210. The multiple detectors 210 each convert one of the light signals into an electrical receive signal. An integrated multichannel receiver 212 operates on the electrical receive signals to extract the corresponding streams of digital data. An interface module 214 buffers the streams of digital data and converts them to a suitable format for communications of the terminal node's internal bus 216, in accordance with a standard I/O bus protocol. In some embodiments, the conversion performed by the interface module 214 includes error correction and payload extraction.

From the internal bus 216, the interface module 214 also accepts digital data for transmission. In at least some embodiments, the interface module 214 packetizes the data with appropriate headers and end-of-frame markers, optionally adding a layer of error correction coding and/or a checksum. A multichannel transmitter 222 accepts the transmit data streams from interface module 214 and converts the digital signals into analog electrical drive signals for emitters 220, causing the emitters to generate optical signals that are coupled to a channel coupler 218. The channel coupler 218 provides them as a combined optical signal to the circulator 206, which forwards it as an outgoing signal to optical fiber 200.

Figure 3:
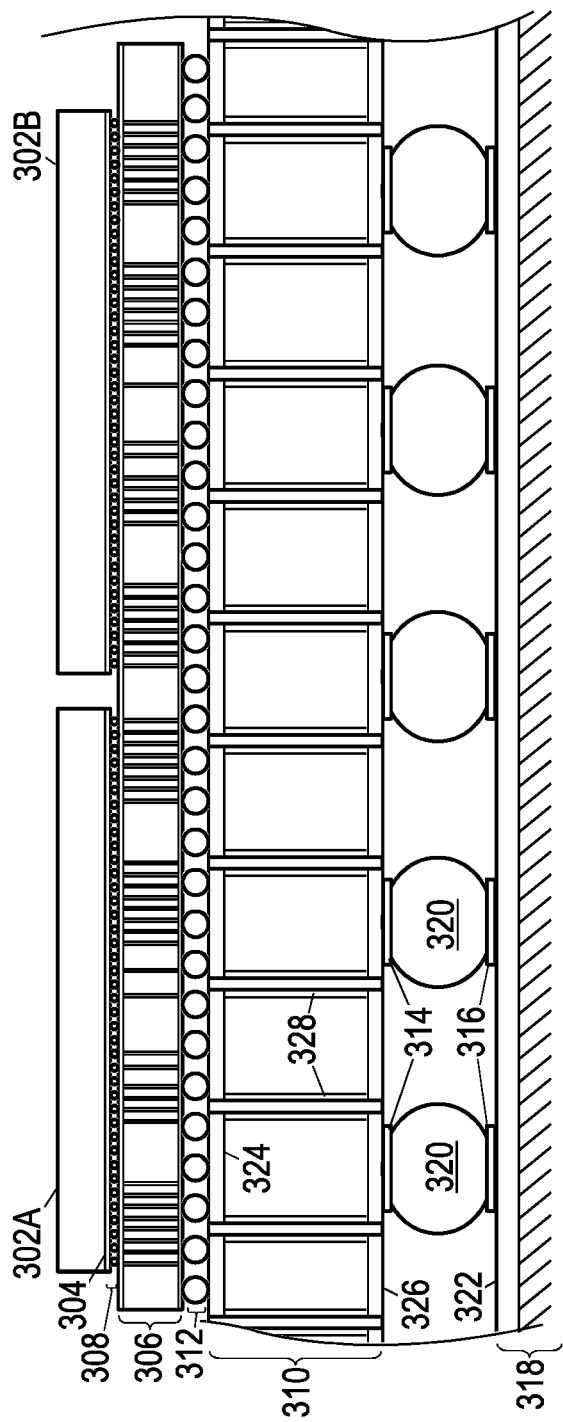
FIG. 3 is a partial cross-section of an illustrative microelectronic assembly.

In the embodiment of FIG. 2, the multichannel receiver 212, multichannel transmitter 222, and interface module 214, are packaged together in a multichip module, preferably implemented as IC dies on an interposer in a 2.5D package 230. FIG. 3 is a cross-section of an illustrative 2.5D microelectronic assembly having multiple IC dies 302A, 302B with integrated circuitry 304 in a flip-chip configuration (i.e., with die substrate flipped to position the patterned areas and contacts adjacent to the mounting surface) attached to upper contacts of an interposer 306 by micro bumps 308. The lower contacts of interposer 306 are attached to the internal (upper) contacts of package substrate 310 by C4 ("Controlled Collapse Chip Connection") bumps 312. TSVs (through-silicon vias) penetrate the interposer substrate to enable electrical connections between the patterned metal layers on the upper surface and patterned metal layers on the lower surface. The patterned metal layers on the lower surface include the interposer's lower contacts, to which the C4 bumps attach.

When the package is incorporated into a larger system, the external (lower) contacts 314 of the package substrate 310 are attached to solder contacts 316 on the circuit board 318 (or other system substrate) by solder bumps 320. Printed circuit traces 322 on the circuit board 318, as well as vias 328 and printed circuit traces 324, 326 on the upper and lower surfaces of package substrate 310, electrically connect the C4 bumps 312 to the other components on the circuit board 318.

Though the figures are not drawn to scale, an illustrative micro bump diameter would be about 20 micrometers. The thickness of the IC dies 302A, 302B and interposer 306 may range as low as about 0.2 mm or slightly less, though more typical values would be about twice this minimum thickness. The interposer 306, of course, has length and width dimensions sufficient to accommodate all of the desired IC dies, and the package substrate has sufficient dimension to accommodate the interposer in turn. A typical C4 bump diameter is about 100 micrometers, with a pitch of about 160 micrometers.

Figure 4:
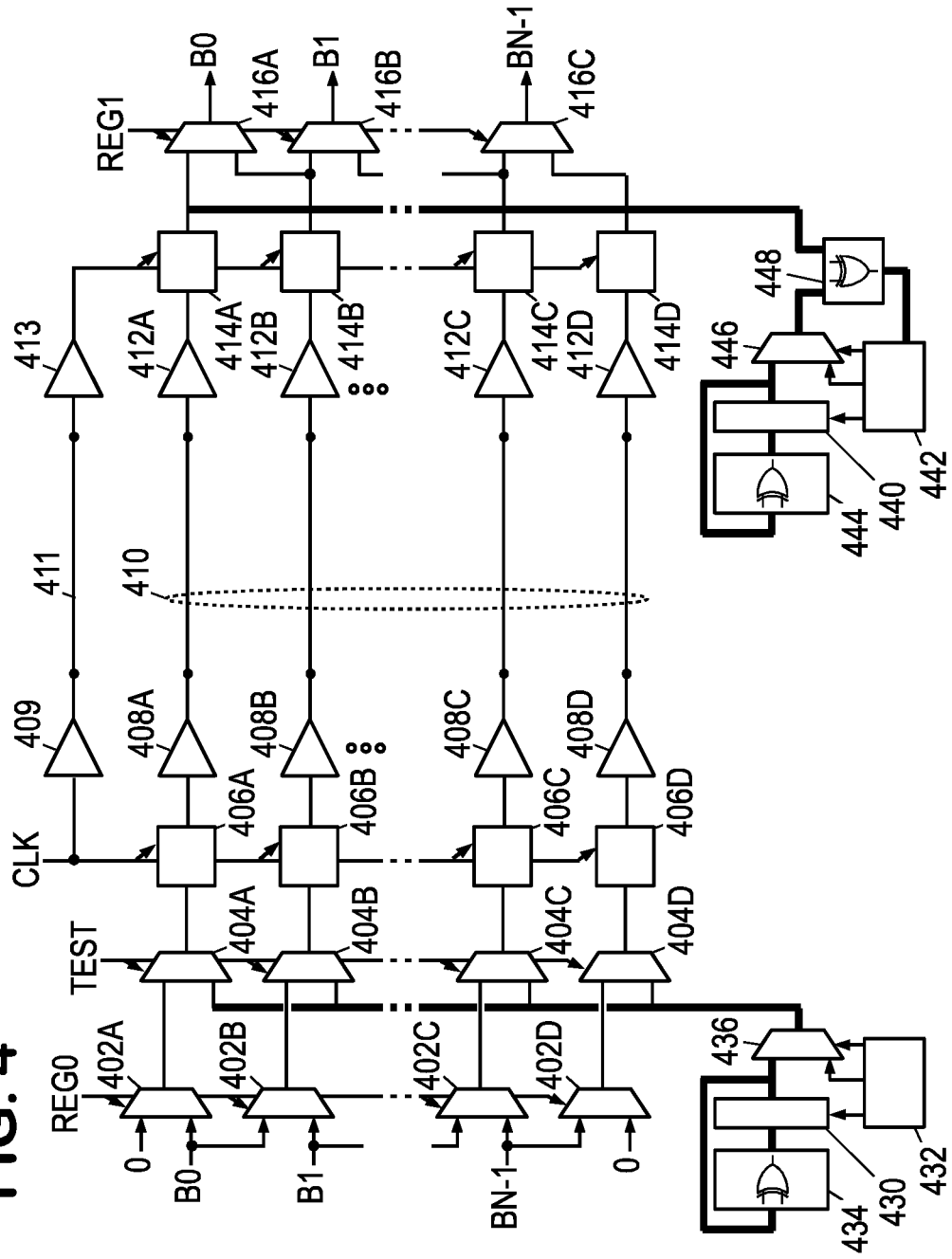
FIG. 4 is a schematic of an illustrative parallel PRBS test circuit for interposer connections.

The circuitry on the IC dies is formed from layers of dielectric, polysilicon, and/or metal deposited and patterned over diffused dopant regions in accordance with established semiconductor device manufacturing techniques. The contemplated integrated circuitry includes a test circuit on each die for detecting interconnect defects and routing around them if possible. FIG. 4 provides an illustrative schematic of such test circuitry employing parallel PRBS generators to simultaneously check multiple interposer traces for connection faults.

In the circuitry of FIG. 4, a set of N+1 input multiplexers 402A-402D receives N input bits labeled B0 thru BN−1. Each of the input multiplexers (except those at the edges) receives a corresponding input bit and an adjacent input bit, thereby providing each input bit with two possible paths through the set of input multiplexers 402A-402D. Each input multiplexer 402A-402D is coupled (indirectly) to a corresponding one of the N+1 traces 410 on the interposer. A control register REG0 provides selection signals to the input multiplexers 402A-402D to steer the N input bits across N of the N+1 interposer traces 410.

As previously mentioned, the input multiplexers 402A-402D are not coupled directly to the traces 410. Rather the outputs from the input multiplexers 402A-402D are each coupled to a corresponding test multiplexers 404A-404D, which select between the data from the input multiplexers and one of a set of test inputs from a parallel PRBS generator (discussed further below). A TEST signal is provided as a selection input to each of the test multiplexers 404A-404D to substitute the test inputs during the interconnect testing process.

A set of latches 406A-406D receives the outputs from the test multiplexers 404A-404D. A clock signal CLK is coupled to each of the latches in the set, causing the latches to be updated synchronously. A set of drivers 408A-408D provides sufficient current and/or voltage to timely communicate the latch contents from the originating IC die across the micro bumps to the conductive traces 410 on the interposer and thence via micro bumps to the destination IC die. At the destination IC die, a set of receive buffers 412A-412D detects the received signals. A set of receive latches 414A-414D synchronously captures the received signals in response the clock signal CLK, which is conveyed from the originating die via a driver 409, a interposer trace 411, and a receive buffer 413.

A set of N output multiplexers 416A-416D receives the output of the N+1 receive latches 414A-414D, selecting each bit (B0 thru BN−1) from the two paths upon which it could be received. A control register REG1 provides selection signals to the output multiplexers in a fashion that compensates for the steering operation of input multiplexers 402A-402D, thereby enabling data communication even when one of the interposer traces 410 is faulty.

To detect any faults and determine appropriate settings for the input and output multiplexers, a parallel PRBS generator is employed. Design techniques for such generators are described by E. Laskin in "On-chip self-test circuit blocks for high-speed applications", MASc Thesis, Univ. Toronto, 2006, which is hereby incorporated herein by reference. Such generators include a set of latches or other memory elements, represented in FIG. 4 as memory registers 430, 440, that contain a binary representation of the generator's present state. A controller 432, 442, can use a predetermined seed value to set the initial state of the generator. Thereafter, a set of logic gates 434, 444 derive a subsequent state from the present state and each subsequent state thereafter, thereby driving each bit in the memory register through a maximal length pseudo-random binary sequence (PRBS). The PRBS's are the same for each register bit, but have different phases from each other.

The size of the memory register determines the length of the maximal length PRBS as well as the number of distinct sequences that can be provided in parallel. A larger register provides more sequences in parallel, with each sequence being longer, and consequently a higher order generator (larger register) may be preferred. However, there are diminishing returns, so register sizes in the range between 5 and 40 are expected to be sufficient for most purposes. Although one full cycle of the PRBS generator (enough iterations to return the register to its initial state) is expected to be sufficient for testing purposes, the number of PRBS cycles used for testing is a design parameter that can be varied as needed. Where the number of traces exceeds the number of parallel sequences, the generated sequences may be "echoed", i.e., duplicated and optionally delayed by a clock cycle, provide a sequence for each interposer trace. FIG. 6 shows an example that triples the number of parallel PRBS sequences using additional registers 430A, 430B to echo the initial set of parallel PRBSs provided by register 430. to a longer sequence and more parallel sequences.

The register bits are provided in parallel from register 430, via preamble multiplexer 436, to the test inputs of test multiplexers 404A-404B; and from register 440, via preamble multiplexer 446, to reference inputs of a comparator 448. Before the controller 432, 442, sets the initial state and begins iteratively generating the PRBSs, it provides a preamble to signal the start of the PRBS. For example, the preamble may take the form of a preset number of zeros followed by a one, and the preamble is sent simultaneously on each of the traces 410.

At the destination die, the outputs of receive latches 414A-414D are provided to test inputs of comparator 448, which compares them bit-wise with the PRBSs provided to its reference inputs. The bitwise comparison results are monitored by the controller 442 to identify which, if any, of the traces 410 are faulty. If no more than one faulty connection is detected, the input and output multiplexers 402, 416, are set to select the first path for bits above the faulty trace, and the second path for bits below the faulty trace, leaving the faulty trace unused. The controller 442 may communicate the location of a detected fault to a test controller, which then programs the nonvolatile registers REG0, REG1. If more than one fault is present in each group of traces 410, the test controller determines that the microelectronic assembly is defective and discards it.

Controller 442 in the destination IC die relies on detection of the preamble to seed the memory register 440 and generate reference PRBSs for comparator 448. The "preamble" generated by controller 442 may consequently be simply zeros on all lines. After comparator 448 verifies that the signals received on at least N of the traces have matching zeros for at least the preset number of clock cycles (e.g., 31), the controller starts monitoring for a mismatch on at least N of the traces between the "all zeros" reference and the "all ones" used by controller 432 to indicate the end of the preamble. (A defect may prevent all N+1 interposer traces 410 from carrying the correct information, and more than one defect is not correctable in any event.) Upon detecting this mismatch of at least N traces, controller 442 initiates the generation of the reference PRBSs.

FIG. 5 is a flow diagram of an illustrative parallel PRBS test method for interposer connections. In block 502 the manufacturer provides, to each of the IC dies that are to be interconnected by an interposer, test circuitry that includes parallel PRBS generators. In block 504, the manufacturer mounts the IC dies on an interposer, preferably an interposer having connection redundancy, thereby producing a microelectronic assembly. In block 506, a testing apparatus initiates testing of the microelectronic assembly. Among other things, the testing process includes causing at least one of the IC dies (hereafter, the "originating IC die") to send a preamble to another one of the IC dies (hereafter, the "destination IC die") to notify the destination die that transmission of parallel PRBSs is beginning. In block 508, the originating IC die sends the PRBSs in parallel to simultaneously test the functionality of each of the interposer traces 410. The destination IC die performs bitwise comparison of the test PRBSs communicated via the interposer traces 410 with corresponding reference PRBSs to simultaneously test each trace for connection faults.

In block 510, the test controller determines whether too many faults are present in the traces, and if so, in block 512 the test controller marks the assembly as defective and discards it. Otherwise, in block 514, the test controller programs nonvolatile registers in the IC dies, enabling multiplexer arrays to steer the data around any detected faults.

The foregoing principles have been discussed in a specific context for explanatory purposes. However, the reader will recognize that they are applicable in a much wider range of contexts. Numerous alternative forms, equivalents, and modifications will become apparent to those skilled in the art once the above disclosure is fully appreciated. For example, the foregoing description focuses on implementations having one-way communication across a group of interposer traces forming a point-to-point bus, but can be readily adapted for two-way communication buses and buses shared among multiple IC dies. While IC dies have been described as originating or destination IC dies, it is possible for a given IC die to be both an originating and a destination IC die. It is intended that the claims be interpreted to embrace all such alternative forms, equivalents, and modifications that are encompassed in the scope of the appended claims.

What is claimed is:

1. A microelectronic assembly that comprises:
a substrate electrically connected in a flip-chip configuration to an originating IC (integrated circuit) die and to a destination IC die,
the substrate having multiple conductive traces for a parallel communications bus between the originating and destination IC dies,
the originating IC die having a first parallel PRBS (pseudo-random binary sequence) generator to drive test PRBSs with different phases in parallel across the multiple conductive traces,
the destination IC die having:
a second parallel PRBS generator to create reference PRBSs with different phases; and
a bitwise comparator coupled to receive the test PRBSs from the multiple conductive traces and to compare the test PRBSs to the reference PRBSs to provide concurrent fault monitoring for each of the multiple conductive traces.

2. The assembly of claim 1, wherein the test PRBSs are preceded by a start pattern having at least one "zero" sent simultaneously on each of the multiple conductive traces followed by a "one" sent simultaneously on each of the multiple conductive traces.

3. The assembly of claim 1, wherein first parallel PRBS generator is iterated starting with a seed value, and wherein the second parallel PRBS generator is initialized with the seed value when a start pattern is detected on the multiple conductive traces.

4. The assembly of claim 1, wherein the first and second parallel PRBS generators each provide echoed PRBSs for an expanded number of parallel sequences.

5. The assembly of claim 1, wherein the parallel communications bus is N bits wide, and wherein the multiple conductive traces of the substrate include at least one extra trace to provide redundancy protection against a faulty trace.

6. The assembly of claim 5, wherein each of the originating and destination IC dies includes a multiplexer array that enables signals for the parallel communications bus to be routed around the faulty trace.

7. The assembly of claim 6, wherein the destination IC die includes a correction controller coupled to the bitwise comparator to identify which if any of the multiple conductive traces have a fault and to responsively determine a setting for at least one of the multiplexer arrays to route around the fault.

8. A microelectronic assembly test method that comprises:
receiving a start pattern synchronously on each of multiple interposer traces coupling an originating IC die to a destination IC die;
initializing a parallel PRBS generator upon detecting the start pattern;
performing a bitwise comparison of reference PRBSs from the parallel PRBS generator with test PRBSs received via the multiple interposer traces;
identifying which, if any, of the multiple interposer traces are faulty based on the bitwise comparison; and
if a faulty interposer trace is detected, configuring the originating IC die and the destination IC die to avoid use of the faulty interposer trace.

9. The method of claim 8, wherein the start pattern comprises at least one "zero" sent simultaneously on each of the multiple interposer traces followed by a "one" sent simultaneously on each of the multiple interposer traces.

10. The method of claim 9, wherein said initializing includes storing a predetermined seed value in a register as an initial state for the parallel PRBS generator.

11. The method of claim 10, further comprising:
iterating to generate on each clock cycle a subsequent state from a present state in the register;
deriving from each bit in the register a corresponding one of the reference PRBSs; and
echoing at least one of the reference PRBSs derived from the register bits to provide at least one additional one of the reference PRBSs.

12. The method of claim 8, wherein each of the originating and destination IC dies includes a multiplexer array, and wherein said configuring includes programming the multiplexer arrays to route communication signals around the faulty trace using one or more redundant interposer traces.

13. An IC die that comprises:
a set of input multiplexers that map N bits along N+1 interposer traces connecting said IC die to another IC die;
a set of test multiplexers that insert on each of said interposer traces a corresponding one of multiple test PRBSs; and
a parallel PRBS generator that provides the multiple test PRBSs in parallel to the set of test multiplexers, the multiple test PRBSs having different phases.

14. The IC die of claim 13, further comprising:
a set of output multiplexers that map receive signals from N+1 interposer traces to N output bit lanes, the receive signals including incoming test PRBSs during testing; and
a bitwise comparator that compares each of the incoming test PRBSs with corresponding reference PRBSs.

15. The IC die of claim 14, further comprising:
a second parallel PRBS generator that provides the reference PRBSs in parallel to the bitwise comparator, the reference PRBSs having different phases.

16. The IC die of claim 13, wherein the parallel PRBS generator includes a preamble multiplexer to insert a start pattern ahead of the multiple test PRBSs.

17. The IC die of claim 16, wherein the start patter comprises at least one "zero" sent simultaneously on each of the interposer traces followed by a "one" sent simultaneously on each of the interposer traces.

18. The IC die of claim 13, wherein the parallel PRBS generator is initialized with a predetermined seed value.

19. The IC die of claim 13, wherein the parallel PRBS generator echoes one or more of the multiple test PRBSs for an expanded number of parallel sequences.

20. The IC die of claim 13, further comprising a set of latches driven synchronously by a clock signal that is also communicated via a dedicated interposer trace.

* * * * *